| United States Patent [19] | [11] Patent Number: 4,793,854 |
|---|---|
| Shimotori et al. | [45] Date of Patent: Dec. 27, 1988 |

[54] HIGHLY PURE TITANIUM AND PROCESS FOR PRODUCING THE SAME

[75] Inventors: Kazumi Shimotori, Kawasaki; Yoshiharu Ochi, Ichihara; Hideo Ishihara; Takenori Umeki, both of Yokohama; Takashi Ishigami, Chigasaki, all of Japan

[73] Assignee: Kabushiki Kaisha Toshiba, Kawasaki, Japan

[21] Appl. No.: 51,772

[22] Filed: May 20, 1987

[30] Foreign Application Priority Data

May 30, 1986 [JP] Japan .................................. 61-123463

[51] Int. Cl.$^4$ .......................... C22B 34/12; C22B 9/22
[52] U.S. Cl. .................................. 75/10.10; 75/10.13; 75/10.64; 75/65 EB
[58] Field of Search ................ 75/10.10, 10.13, 10.64, 75/65 EB

[56] References Cited

U.S. PATENT DOCUMENTS

| 2,819,158 | 1/1958 | Johnston | 75/10.26 |
|---|---|---|---|
| 2,878,008 | 3/1959 | Ishizuka | 266/16 |
| 3,024,102 | 3/1962 | Brown | 75/10.26 |
| 3,406,056 | 11/1968 | Albert et al. | 75/84 |

OTHER PUBLICATIONS

J. Appl. Phys., vol. 51, No. 1, Jan. 1980; pp. 342-349; S. P. Murarka and D. B. Fraser; "Thin Film Interaction Between Titanium and Polycrystalline Silicon".
Journal of Metals, Dec. 1984, pp. 39-47; H. B. Bomberger and F. H. Froes; "The Melting of Titanium".
Chemical Abstract, vol. 96, 1982, p. 264, Abstract No. 730011w.
Chemical Abstract, vol. 106, 1987, p. 298, Abstract No. 181070y.
Materials for Rare Metal Symposium, Jul. 1986, p. 28.

*Primary Examiner*—Peter D. Rosenberg
*Attorney, Agent, or Firm*—Foley & Lardner, Schwartz, Jeffery, Schwaab, Mack, Blumenthal & Evans

[57] ABSTRACT

Disclosed is a highly pure titanium which comprises containing not more than 200 ppm of oxygen; not more than 30 ppm each of elements consisting of iron, nickel and chromium, and not more than 0.1 ppm each of elements consisting of sodium and potassium.

Disclosed is also a process for preparing the above highly pure titanium which comprises melting a crude titanium obtained by molten salt electrolysis, in a high vacuum of $5 \times 10^{-5}$ mbar or less.

9 Claims, 2 Drawing Sheets

HIGHLY PURE TITANIUM AND PROCESS FOR PRODUCING THE SAME

BACKGROUND OF THE INVENTION

This invention relates to a titanium (or a titanium material) having high purity, and, more particularly, a highly pure titanium useful as a material for use in forming a wiring network on the surface of a semiconductor device.

On the surface of semiconductor devices, a wiring network complexity patterned for a certain use is formed by use of a conductive metallic material. In general, to form such a wiring network, a thin film of conductive metal such as polysilicon (a-Si), Al, Au and so forth is first formed on the surface of a semiconductor device by applying a sputtering method, and thereafter the thin film is treated by etching to remove portions other than the desired wiring circuits to give a wiring network remaining on the surface.

Recently, devices have been made increasingly light, thin, short and small in size, and, as a result, an effort is made to densely form the wiring network, namely, to make the width of a circuit narrower or the thickness of a circuit thinner.

With increase in integration of semiconductor device like this, there is always caused a problem that a signal delay is caused by wiring-resistance of a wiring material used, or a problem that the material is melted by the resistance heat generated in the wiring network of an actuated device when the material comprises a low-melting material.

For these reasons, there are strong demands for wiring materials that are high-melting and low-resistant at the same time, and also do not require any modification of the process in the production of LSI, VLSI or ULSI, and Ti, comparable to Mo and Ta, has attracted notices as such a materials.

On the other hand, a sputtering method is chiefly employed in the step of forming a conductive metallic thin film, which is a step preliminary for the formation of wiring networks on the surface of semiconductor devices.

This is a method in which certain ion species are injected into a target comprised of a constituent material for a thin film to be formed on the surface of a semiconductor device, so that the target-constituting material may be ejected to be adhered on the surface of the semiconductor device.

In applying this sputtering method, it is necessary to prepare the sputtering target with use of the metallic material mentioned above.

Namely, a titanium material is used as the target when a wiring network comprising Ti is to be formed. Here, it is essential for the titanium material to be highly pure. This is because, when, for example, oxygen is contained in the titanium material as an impurity even in a very small amount, the titanium material itself may become brittle causing an increase in the electric resistance of the thin film formed, whereby accidents such as melt-break of wiring networks may frequently occur; in the case of heavy metals such as Fe, Ni and Cr, they may constitute a cause of a leak at the interfacial joint between VLSI or the like and the thin film formed; or, in the case of alkali metals such as Na and K, they may be readily diffused and migrated in an insulating film provided on the VLSI or the like to deteriorate properties of the device. Also, U or Th, radiating alpha rays, may damage the device, resulting in extreme lowering of the operational reliability of the device.

At present, the following three processes are widely used as the process for producing the titanium material. The first is a process in which a titanium compound such as $TiCl_4$ is subjected to thermal reduction by using active metals such as Na, K and Mg, and is called the Kroll process or Hunter process. The second process is a process in which the titanium compound such as $TiCl_4$ is subjected to thermal decomposition, and is called an iodide process. The third process is a process in which a $TiO_2$-NaF-KF mixture or a $CaCl_2$-$TiO_2$ mixture is subjected to molten salt electrolysis.

In general, the titanium material thus produced, which usually has a spongy or acicular shape, is, for example, melted by arcs in a vacuum of $1.3 \times 10^{-2}$ to $1.3 \times 10^{-3}$ mbar to be formed into an ingot, which is used as a target material.

However, the titanium material produced by the conventional processes mentioned above have a purity of only about 99% to 99.9%, which can be used as sputter target to be used in 64K bit devices, but are not suitable as wiring materials when used in 256K bit, 1 M bit or 4 M bit devices.

In other words, as mentioned above, the less impurities a titanium material has, the more desirable it is as a wiring material. For example, taking account of a wiring material for an LSI of 4 M bits or more, it is found that oxygen must be not more than 200 ppm; heavy metals, not more than 30 ppm; and alkali metals, not more than 0.1 ppm. However, it is very difficult according to the above conventional industrial processes to produce a titanium having such a high purity.

SUMMARY OF THE INVENTION

An object of this invention is to provide a titanium that can solve the above problems involved in titanium used as wiring materials for LSI, and has very small content of impurity elements which may adversely affect the performances of a device, and yet can be produced with ease in an industrial scale.

To achieve the above object, the present inventors have made intensive studies on the aforesaid respective production processes. As a result, it was found that, when a spongy or acicular titanium obtained from an ore is melted by arcs and casted, only oxygen content may increase in the resulting ingot even if the titanium has a high purity. Specifically speaking, it increased in amount of 200 to 300 ppm per one time of arc melting. Based on this new finding, they have made further studies to find that an acicular titanium, prepared by a molten salt electrolysis, may be melted to form an ingot in a high vacuum of $5 \times 10^{-5}$ mbar or less according to an electron beam melting method (EB method) in place of the arc melting method, whereby the resulting ingot can be made to have very small contents of oxygen, heavy metals (such as Fe, Ni and Cr), alkali metals (such as Na and K) mentioned above, and can be useful as a wiring material for LSI, VLSI or ULSI. Thus, the highly pure titanium of this invention has been created.

Accordingly, the highly pure titanium of this invention is characterized by containing not more than 200 ppm of oxygen; not more than 30 ppm each of elements consisting of iron, nickel and chromium, and not more than 0.1 ppm each of elements consisting of sodium and potassium, and also characterized as a titanium feasible for mass production in an industrial scale. The process for producing the same is characterized by subjecting a crude titanium obtained by a molten salt electrolysis to electron beam melting.

DESCRIPTION OF THE PREFERRED EMBODIMENTS

Figure 1:
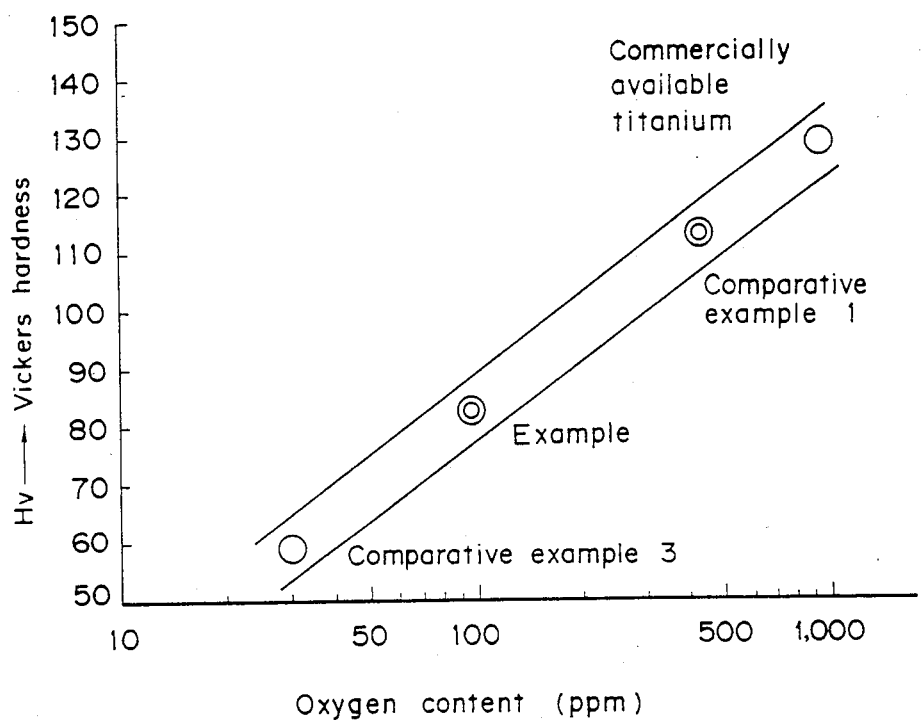
FIG. 1 shows the relationship between oxygen content (ppm) and Vickers hardness (Hv) of each titanium material.

The titanium material of this invention can be produced in the following manner.

First of all, an acicular titanium is produced by a molten salt electrolysis. For example, $K_2TiF_6$ may be used as a starting titanium, and $TiO_2$ having smaller content of U and Th is preferably used. The electrolysis may be preferably carried out using an electrolytic bath comprising a $K_2TiF_6$-NaCl solution, at a temperature of 730° to 755° C. and under a voltage of 6.0 to 8.0 V.

The molten salt electrolysis carried out under the conditions set out above can produce an acicular titanium usually containing 100 to 160 ppm of oxygen; 0.75 to 6 ppm each of Fe, Cr and Ni; and 96 to 325 ppm each of Na and K.

The resulting acicular titanium may be fed into an electron beam melting furnace while preventing external contamination. It can be contemplated that the acicular titanium obtained by the above molten salt electrolysis is usually pressed into a compact body, which is used as an electrode to carry out the electron beam melting. Since, however, in such an instance, contamination occurs due to tools and deformation caused in the formation of the compact body, it is required in this invention to feed the acicular titanium as it is in a vacuum by a granule feeder with vibration system, followed by the electron beam melting.

In the electron beam melting furnace, electron beam melting of the acicular titanium may be carried out while keeping the inside of the furnace in a vacuum of $5 \times 10^{-5}$ mbar or less, preferably of $2 \times 10^{-5}$ mbar or less and using Freon baffle to prevent a diffusion pump oil from being mixed into the furnace.

There is no particular limitation in the operation conditions in the electron beam melting, but the melting rate is required to be selected taking account of the effect of purification of Na and K or the absorption of contamination by oxygen. For example, a preferable condition is such that the melting rate is set to 1.75 to 2.3 kg/hr.

In the course of this step, the problem of increase in oxygen content that may occur when the usual arc melting method is used can be eliminated by great improvement in the evacuating ability, and, in the resulting electron beam cast material, oxygen can be controlled to be kept at 200 ppm or less with large decreases in Na and K, and other impurity elements also can be decreased and by no means increased.

This invention will be described in greater detail by the following Example.

EXAMPLE

Molten salt electrolysis was carried out using an electrolytic bath comprising $K_2TiF_6$-NaCl (weight ratio: $K_2TiF_2$, 16%; NaCl, 84%), at electrolytic temperature of 755° C., current of 200 A and voltage of 8.0 V to produce an acicular titanium containing 100 to 160 ppm of oxygen, 10 ppm or less of Fe, 18 ppm or less of Cr, about 1 ppm of Ni, about 325 ppm of Na and about 175 ppm of K. This titanium material was inserted into a granule feeder as it was, which was then thrown into an electron beam melting furnace under vibration while preventing external contamination in vacuum. Electron beam melting was carried out while keeping the inside of the furnace in a high vacuum of $5 \times 10^{-5}$ mbar and using a Freon baffle to prevent a diffusion pump oil from being mixed into the furnace, and under the conditions of 20 Kv, filament current of 1.3 to 1.5 A, EB output of 26 to 30 KW and melting rate of 2 kg/hr, to obtain an ingot of 80 mm in diameter.

The resulting ingot was examined by elementary analysis to obtain the results as shown in the table.

A similar titanium material was cast according to arc melting in a vacuum of $8 \times 10^{-4}$ mbar to produce an ingot (Comparative Example 1). Results of elementary analysis on this ingot are also shown together. A spongy titanium obtained by reducing titanium tetrachloride ($TiCl_4$) with magnesium, namely, a crude titanium produced by Kroll method, was subjected to arc melting to obtain a titanium material, which was examined by similar analysis to obtain the results shown in the table as Comparative Example 2.

Further, titanium tetraiodide ($TiI_4$) was subjected to thermal decomposition to obtain a crystal titanium, and similar analysis was carried out by using it to obtain the results shown in the table as Comparative Example 3.

TABLE

| Sorts of impurities | Example (ppm) | Comparative example 1 (ppm) | Comparative example 2 (ppm) | Comparative example 3 (ppm) |
|---|---|---|---|---|
| O | 100 to 150 | 200 to 300 | 400 | 20 to 100 |
| Fe | 0.4 to 0.8 | 3 to 5 | 50 | 20 |
| Cr | 0.3 to 0.5 | 3 to 6 | 10 | 15 |
| Ni | 0.1 to 0.3 | 0.75 | 50 | 20 |
| Na | 0.05 | 0.7 | 0.05 | 10 |
| K | 0.05 | 0.5 | 0.05 | 10 |
| U | <0.001* | <0.001* | <0.001* | <0.001* |
| Th | <0.001* | <0.001* | <0.001* | <0.001* |

*A value of not more than 0.001 ppm was not detectable.

For reference, the hardness of the surface (Vickers hardness: Hv) was measured on each of the titanium of Example, the titanium of Comparative Example 1 and the titanium of Comparative Example 3 and a commercially available titanium (oxygen content: about 1,000 ppm) to show in FIG. 1 the relationship between each value obtained and oxygen content. As will be clear from the table, the titanium according to this invention has softness necessary as a wiring material for use in LSI, VLSI, ULSI, etc.

Figure 2:
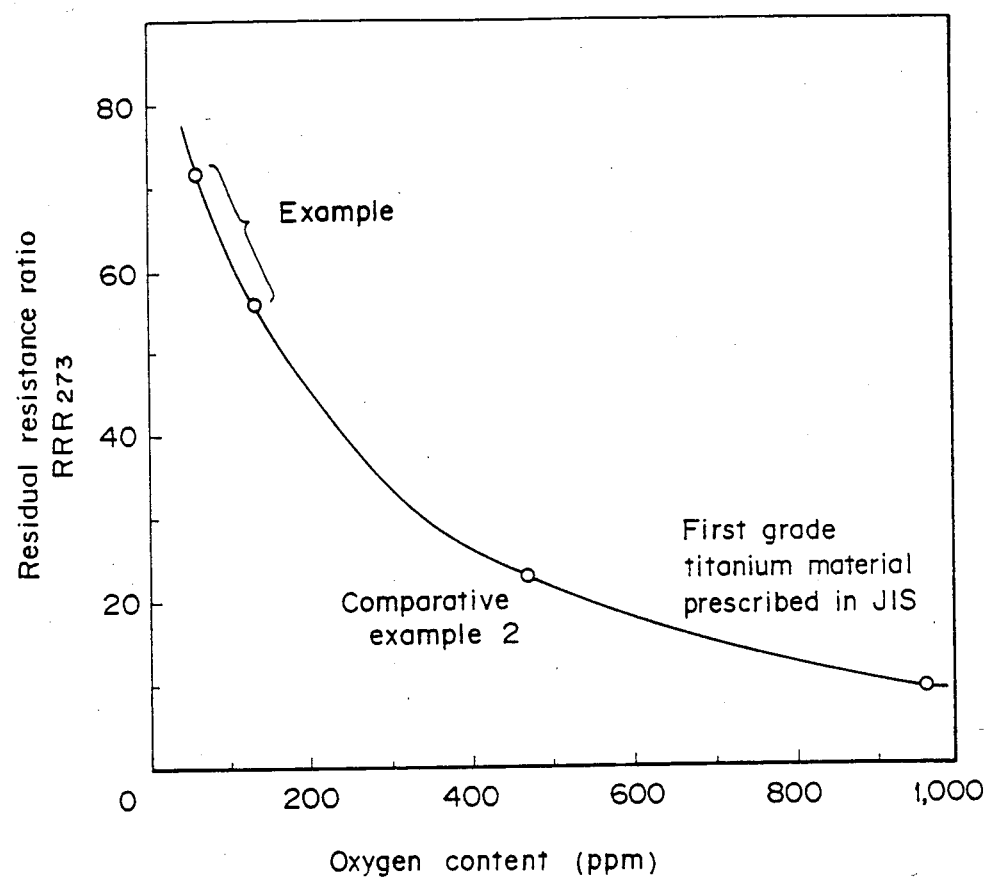
FIG. 2 shows the relationship between impurity content, particularly oxygen content (ppm) to be most questioned, and residual resistance ratio $RRR_{273}$.

As a value that can further show an excellent performance of the highly pure titanium of this invention, reference can be made on residual resistance ratio RRR273. Cooling a metal to a low temperature, the electric resistance due to thermal vibration may disappear to make resistance zero in nature, but resistance $\rho_0$ may remain because of the presence of impurities or the like. This is residual resistance, showing that the greater the ratio to $\rho_{273}$ at T=273 K, i.e., $RRR_{273} = \rho_{273}/\rho_0$ is, the less the residual resistance is to have a higher purity. In this invention, tests were carried out to examine the relationship in these by use of titanium materials obtained in Example 2 and Comparative example 2 and a first grade titanium material (JIS H46TP28) prescribed in JIS (Japanese Industrial Standard) H2152, to find that the highly pure titanium of this invention shows an excellent value of $RRR_{273} \geqq 45$. This relationship is shown in FIG. 2.

Before electron beam melting, degassing was further carried out on the starting material in a vacuum of $1.3 \times 10^{-4}$ mbar or more and at 1000° C. or more, whereby the yield increased greatly.

As will be clear from the above results, the titanium material of this invention has very small content of undesirable impurity elements when viewed as a wiring material for LSI, VLSI or ULSI. The process for producing the same is also industrially very useful, and can be said to be useful as compared with a case where the iodide method using a material of relatively smaller impurity content is a process yielding lower productivity.

We claim:

1. A process for producing a highly pure titanium containing not more than 200 ppm of oxygen; not more than 30 ppm aach of elements consisting of iron, nickel and chromium, and not more than 0.1 ppm each of elements consisting of sodium and potassium, which comprises melting a crude titanium obtained by molten salt electrolysis, in a high vacuum of $5 \times 10^{-5}$ mbar or less.

2. The process for producing a highly pure titanium according to claim 1, wherein the melting comprises electron beam melting.

3. The process for producing a highly pure titanium according to claim 1, wherein, before melting, the starting titanium is subjected to degassing in a vacuum of $1.3 \times 10^{-4}$ mbar at 1000° C. or more.

4. The process for producing a highly pure titanium according to claim 1, wherein said crude titanium is an acicular titanium.

5. The process for producing a highly pure titanium according to claim 2, wherein an acicular titanium is obtained by molten salt electrolysis, and said acicular titanium is subjected to electron beam melting as it is.

6. A method of producing a wiring network on the surface of a semiconductor device, comprising the steps of:
    forming a thin film from highly pure titanium comprising not more than 200 ppm of oxygen; not more than 30 ppm each of elements consisting of iron, nickel and chromium, and not more than 0.1 ppm each of elements consisting of sodium and potassium; and
    treating said thin film by etching to remove portions other than the desired wiring network.

7. A method according to claim 6, wherein said thin film is formed by sputtering.

8. A method according to claim 7, wherein said highly pure titanium is formed by melting a crude titanium obtained by molten salt electrolysis in a high vacuum of $5 \times 10^{-5}$ mbar or less.

9. A method according to claim 7, wherein said melting comprises electron beam melting.

* * * * *

REEXAMINATION CERTIFICATE (1822nd)
United States Patent [19]
Shimotori et al.

[11] B1 4,793,854
[45] Certificate Issued  Oct. 27, 1992

[54] HIGHLY PURE TITANIUM AND PROCESS FOR PRODUCING THE SAME

[75] Inventors: Kazumi Shimotori, Kawasaki; Yoshiharu Ochi, Ichihara; Hideo Ishihara; Takenori Umeki, both of Yokohama; Takashi Ishigami, Chigasaki, all of Japan

[73] Assignee: Kabushiki Kaisha Toshiba, Kawasaki, Japan

Reexamination Request:
No. 90/002,025, May 14, 1990
No. 90/002,438, Sep. 11, 1991

Reexamination Certificate for:
Patent No.: 4,793,854
Issued: Dec. 27, 1988
Appl. No.: 51,,772
Filed: May 20, 1987

[30] Foreign Application Priority Data

May 30, 1986 [JP] Japan ................................ 61-123463

[51] Int. Cl.⁵ .................... H01L 21/441; C22B 34/12; C22B 9/22
[52] U.S. Cl. .................................. 75/10.1; 75/10.13; 75/10.64; 75/612; 437/187; 437/228
[58] Field of Search .................... 75/10.1, 10.13, 10.64, 75/612; 437/187, 228

[56] References Cited

PUBLICATIONS

Murray, "Metals Handbook", Ninth Edition ASM, 1979, pp. 709–712.
Nardin et al, "Continuous production of titanium from $TiCl_4$ in molten salts", Molten Salt Electrolysis in Metal Production, Inst. of Mining & Metallurgy, symposium in Grenoble, France Sep. 19–21, 1977, pp. 38–41.
Hayashi et al, "Casting Titanium by Using an Electron Beam Skull Furnace", Electron and Ion Beam Science and Technology, John Wiley and Sons, 1965, pp. 415–427.
Smith et al, "Electron Bombardment Melting", Journal of Metals, Feb. 1959, pp. 112–117.
Glang et al, "High Vacuum Technology", Handbook of Thin Film Technology, McGraw-Hill Book Co., 1983 Reissue, pp. 1–3, 16, 17, 2–1, 4, 9, 10, 11, 14, 15, 106, 107, 138, 140, 3–1, 18, 19, 4–40, 7–1, 40, 13–1 through 7, 23–1, 4–7.
Liang, "Impurities in Refractory Metals/Silicides", J. Voc. Sci. Technol. B 2(4), Oct.–Dec. 1984, pp. 714–717.
Webster's New World Dictionary, 2nd College Ed. 1984, pp. 11, 376.
K. Takahashi, "Titanium Industry in Japan", Titanium '80 Science and Technology (4th Int'l Conf. on Titanium) May 19–22, 1980, pp. 17–19.
Ervin et al, "Process for Electrolytic Extraction of Titanium Metal from Titanium Carbide Anodes", Jrnl. Elec. Chem. Soc., vol. 106, No. 2, Feb. 1959, pp. 144–146.
Narita et al, "A High-Speed 1-M Bit EPROM with a Ti-Silicided Gate", IEEE Journal of Solid-State Circuits, vol. SC-20, No. 1, Feb. 1985, pp. 418–429.
Murarka, "Refractory Silicides for Integrated Circuits", J. Vac. Sci. Technol., 17 (4), Jul./Aug. 1980, pp. 775–791.
Maykuth et al, "The Effects of Alloying Elements in Titanium", vol. B, DMIC Report 136B (May 29, 1961), pp. 16–19.
Nicolet et al, "Diffusion Barriers in layered contact structures", J. Vac. Sci. Technology 19 (3), Sep./Oct. 1981, pp. 786–793.
Wittmer et al, "Characteristics of TiN gate metal-oxide semiconductor field effect transistors", J. Appl. Physics 54 (3), Mar. 1983, pp. 1423–1428.
Smith et al, "The Development of Large Scale Electron Bombardment Melting and its Effect on the Composition of Metals and Alloys", Reactive Metals, vol. 2, Conference May 27–29, 1958, pp. 131–146.
McQuillan et al, "Titanium", Academic Press Inc. 1956, pp. 24–27.

*Primary Examiner*—George Wyszomierski

[57] ABSTRACT

Disclosed is a highly pure titanium which comprises containing not more than 200 ppm of oxygen; not more than 30 ppm each of elements consisting of iron, nickel and chromium, and not more than 0.1 ppm each of elements consisting of sodium and potassium.

Disclosed is also a process for preparing the above highly pure titanium which comprises melting a crude titanium obtained by molten salt electrolysis, in a high vacuum of $5 \times 10^{-5}$ mbar or less.

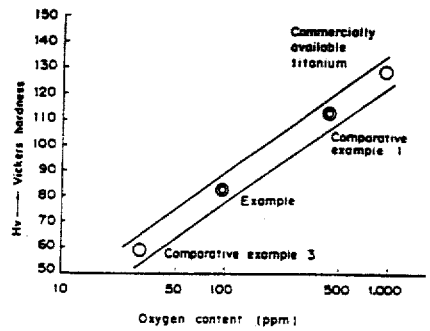

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 6-9 is confirmed.

Claim 1 is determined to be patentable as amended.

Claims 2-5, dependent on an amended claim, are determined to be patentable.

New claims 10-57 are added and determined to be patentable.

1. A process for producing a highly pure titanium containing not more than 200 ppm of oxygen; not more than 30 ppm [aach] *each* of elements consisting of iron, nickel and chromium, and not more than 0.1 ppm each of elements consisting of sodium and potassium, which comprises melting a crude titanium obtained by molten salt electrolysis, in a high vacuum of $5 \times 10^{-5}$ mbar or less.

*10. The process for producing a highly pure titanium according to claim 1, wherein a melting rate of the crude titanium is more than about 1.75 kg/hr.*

*11. The process for producing a highly pure titanium according to claim 2, wherein a melting rate of the crude titanium is more than about 1.75 kg/hr.*

*12. The process for producing a highly pure titanium according to claim 1, wherein a melting rate of the crude titanium is about 1.75 to 2.3 kg/hr.*

*13. The process for producing a highly pure titanium according to claim 2, wherein a melting rate of the crude titanium is about 1.75 to 2.3 kg/hr.*

*14. The process for producing a highly pure titanium according to claim 2, wherein the highly pure titanium contains not more than 150 ppm of oxygen; not more than 0.8 ppm each of elements consisting of iron, nickel and chromium, and not more than 0.05 ppm each of elements consisting of sodium and potassium.*

*15. The process for producing a highly pure titanium according to claim 2, wherein the highly pure titanium contains not more than 150 ppm of oxygen; not more than 0.8 ppm each of elements consisting of iron, nickel and chromium, and not more than 0.05 ppm each of elements consisting of sodium and potassium.*

*16. The process for producing a highly pure titanium according to claim 1, wherein a high vacuum of $2 \times 10^{-5}$ mbar or less is used.*

*17. The process for producing a highly pure titanium according to claim 2, wherein a high vacuum of $2 \times 10^{-5}$ mbar or less is used.*

*18. The process for producing a highly pure titanium according to claim 2, wherein the crude titanium is fed to an electron beam melting furnace in a vacuum by a granule feeder with a vibration system.*

*19. The process for producing a highly pure titanium according to claim 2, wherein before melting, the starting titanium is subjected to degassing in a vacuum of $1.3 \times 10^{-4}$ mbar at 1000° C. or more.*

*20. The process for producing a highly pure titanium according to claim 2, wherein said crude titanium is an acicular titanium.*

*21. A method of producing a wiring network as recited in claim 6, wherein said semiconductor device is a 256K bit device.*

*22. A method of producing a wiring network as recited in claim 6, wherein said semiconductor device is a 1 M bit device.*

*23. A method of producing a wiring network as recited in claim 6, wherein said semiconductor device is a 4 M bit device.*

*24. A method of producing a wiring network on the surface of a semiconductor device as recited in claim 6, wherein the highly pure titanium contains not more than 150 ppm of oxygen; not more than 0.8 ppm each of elements consisting of iron, nickel and chromium, and not more than 0.05 ppm each of elements consisting of sodium and potassium.*

*25. A method of producing a wiring network as recited in claim 24, wherein said semiconductor device is a 256K bit device.*

*26. A method of producing a wiring network as recited in claim 24, wherein said semiconductor device is a 1 M bit device.*

*27. A method of producing a wiring network as recited in claim 24, wherein said semiconductor device is a 4 M bit device.*

*28. The process for producing a highly pure titanium according to claim 1, wherein the highly pure titanium contains not more than 150 ppm of oxygen; not more than 0.4 ppm of iron, not more than 0.3 ppm of nickel, not more than 0.1 ppm of chromium, and not more than 0.05 ppm each of elements consisting of sodium and potassium.*

*29. The process for producing a highly pure titanium according to claim 2, wherein the highly pure titanium contains not more than 150 ppm of oxygen; not more than 0.4 ppm of iron, not more than 0.3 ppm of nickel, not more than 0.1 ppm of chromium, and not more than 0.05 ppm each of elements consisting of sodium and potassium.*

*30. A method of producing a wiring network as recited in claim 24, wherein the highly pure titanium contains not more than 150 ppm of oxygen; not more than 0.4 ppm of iron, not more than 0.3 ppm of nickel, not more than 0.1 ppm of chromium, and not more than 0.05 ppm each of elements consisting of sodium and potassium.*

*31. A method of producing a wiring network as recited in claim 30, wherein said semicoductor device is a 4 M bit device.*

*32. The process for producing a highly pure titanium according to claim 1, wherein the highly pure titanium contains not more than 0.001 ppm of uranium and not more than 0.001 ppm of thorium.*

*33. The process for producing a highly pure titanium according to claim 1, wherein the highly pure titanium contains not more than 150 ppm of oxygen; not more than 0.8 ppm of iron, not more than 0.3 ppm of nickel, not more than 0.5 ppm of chromium, and not more than 0.05 ppm each of elements consisting of sodium and potassium.*

*34. The process for producing a highly pure titanium according to claim 1, wherein the concentration of oxygen is from 100 to 200 ppm.*

35. The process for producing a highly pure titanium according to claim 34, wherein the concentration of oxygen is from 100 to 150 ppm.

36. The process for producing a highly pure titanium according to claim 34, wherein the concentration of iron is from 0.4 to 30 ppm.

37. The process for producing a highly pure titanium according to claim 35, wherein the concentration of iron is from 0.4 to 0.8 ppm.

38. The process for producing a highly pure titanium according to claim 36, wherein the concentration of nickel is from 0.1 to 30 ppm.

39. The process for producing a highly pure titanium according to claim 37, wherein the concentration of nickel is from 0.1 to 0.3 ppm.

40. The process for producing a highly pure titanium according to claim 38, wherein the concentration of chromium is from 0.3 to 30 ppm.

41. The process for producing a highly pure titanium according to claim 39, wherein the concentration of chromium is from 0.3 to 0.5 ppm.

42. The process for producing a highly pure titanium according to claim 40, wherein the concentration of sodium is from 0.05 to 0.1 ppm.

43. The process for producing a highly pure titanium according to claim 41, wherein the concentration of sodium is from 0.05 to 0.1 ppm.

44. The process for producing a highly pure titanium according to claim 42, wherein the concentration of potassium is from 0.05 to 0.1 ppm.

45. The process for producing a highly pure titanium according to claim 43, wherein the concentration of potassium is from 0.05 to 0.1 ppm.

46. The process for producing a highly pure titanium according to claim 6, wherein the concentration of oxygen is from 100 to 200 ppm.

47. The process for producing a highly pure titanium according to claim 46, wherein the concentration of oxygen is from 100 to 150 ppm.

48. The process for producing a highly pure titanium according to claim 46, wherein the concentration of iron is from 0.4 to 30 ppm.

49. The process for producing a highly pure titanium according to claim 47, wherein the concentration of iron is from 0.4 to 0.8 ppm.

50. The process for producing a highly pure titanium according to claim 48, wherein the concentration of nickel is from 0.1 to 30 ppm.

51. The process for producing a highly pure titanium according to claim 49, wherein the concentration of nickel is from 0.1 to 0.3 ppm.

52. The process for producing a highly pure titanium according to claim 50, wherein the concentration of chromium is from 0.3 to 30 ppm.

53. The process for producing a highly pure titanium according to claim 51, wherein the concentration of chromium is from 0.3 to 0.5 ppm.

54. The process for producing a highly pure titanium according to claim 52, wherein the concentration of sodium is from 0.05 to 0.1 ppm.

55. The process for producing a highly pure titanium according to claim 53, wherein the concentration of sodium is from 0.05 to 0.1 ppm.

56. The process for producing a highly pure titanium according to claim 54, wherein the concentration of potassium is from 0.05 to 0.1 ppm.

57. The process for producing a highly pure titanium according to claim 55, wherein the concentration of potassium is from 0.05 to 0.1 ppm.

* * * * *